(12) United States Patent
Mämmilä et al.

(10) Patent No.: US 8,022,712 B2
(45) Date of Patent: Sep. 20, 2011

(54) TESTING ADAPTER

(75) Inventors: Tuomo Mämmilä, Oulu (FI); Mika Piirainen, Oulu (FI); Mika Kellokoski, Haukipudas (FI)

(73) Assignee: JOT Automation Oy, Oulu (FI)

( * ) Notice: Subject to any disclaimer, the term of this patent is extended or adjusted under 35 U.S.C. 154(b) by 506 days.

(21) Appl. No.: 12/096,955

(22) PCT Filed: Dec. 20, 2005

(86) PCT No.: PCT/FI2005/050469
§ 371 (c)(1),
(2), (4) Date: Jun. 11, 2008

(87) PCT Pub. No.: WO2007/071807
PCT Pub. Date: Jun. 28, 2007

(65) Prior Publication Data
US 2008/0315894 A1 Dec. 25, 2008

(51) Int. Cl.
*G01R 1/04* (2006.01)

(52) U.S. Cl. .................................................. 324/555

(58) Field of Classification Search .................. None
See application file for complete search history.

(56) References Cited

U.S. PATENT DOCUMENTS

| 5,436,969 | A | * | 7/1995 | Kobayashi | 379/433.09 |
| 6,062,887 | A | * | 5/2000 | Schuster et al. | 439/218 |
| 6,611,152 | B1 | | 8/2003 | Ortman et al. | |
| 6,724,618 | B1 | * | 4/2004 | Jenkins et al. | 361/679.32 |
| 7,634,297 | B2 | * | 12/2009 | Sin | 455/558 |
| 7,672,691 | B2 | * | 3/2010 | Kim et al. | 455/558 |

FOREIGN PATENT DOCUMENTS

WO WO2005/054877 A1 6/2005

* cited by examiner

*Primary Examiner* — Paresh Patel
(74) *Attorney, Agent, or Firm* — Hoffmann & Baron (57) ABSTRACT

The invention relates to a testing adapter suitable for testing a wireless telecommunication device. The testing adapter comprises a first contact member and a second contact member, the first contact member and the second contact member having at least one degree of freedom relative to each other and arranged to provide an attachable and detachable mechanical coupling with a surface of a component recess of the wireless telecommunication device on the basis of the at least one degree of freedom.

8 Claims, 6 Drawing Sheets

TESTING ADAPTER

CROSS-REFERENCE TO RELATED APPLICATION

This application is a National Phase application of International Application No. PCT/FI2005/050469 filed Dec. 20, 2005, which is incorporated herein by reference.

BACKGROUND OF THE INVENTION

1. Field of the Invention

The invention relates to a testing adapter for testing a wireless telecommunication device.

2. Description of the Related Art

The manufacture of wireless telecommunication devices involves a complex testing procedure where a wireless telecommunication device is placed into a testing arrangement and subjected to mechanical and electronic tests. The testing procedure involves a mechanical contact between the testing arrangement and the wireless telecommunication device in order to position and handle the wireless telecommunication device. The formation of the mechanical contact effects the time used for the testing procedure and techniques required for accessing a testing interface of the wireless telecommunication device. Therefore, it is useful to consider techniques for testing a wireless telecommunication device.

SUMMARY OF THE INVENTION

An object of the invention is to provide an improved testing adapter. According to an aspect of the invention, there is provided a testing adapter for testing a wireless telecommunication device, the testing adapter comprising a first contact member and a second contact member, the first contact member and the second contact member having at least one degree of freedom relative to each other and arranged to provide an attachable and detachable mechanical coupling with a surface of a component recess of the wireless telecommunication device on the basis of the at least one degree of freedom.

The invention provides several advantages. The use of the component recess as a mechanical contact surface between the testing adapter and the wireless telecommunication device provides an efficient way to handle a wireless telecommunication device in a test environment. Furthermore, the use of the component recess as the mechanical contact surface reduces the exposure of the cover of the wireless telecommunication device to mechanical stress and visual defects.

BRIEF DESCRIPTION OF THE DRAWINGS

In the following, the invention will be described in greater detail with reference to the embodiments and the accompanying drawings, in which.

DETAILED DESCRIPTION OF THE PREFERRED EMBODIMENTS

Figures 1A, 1B:
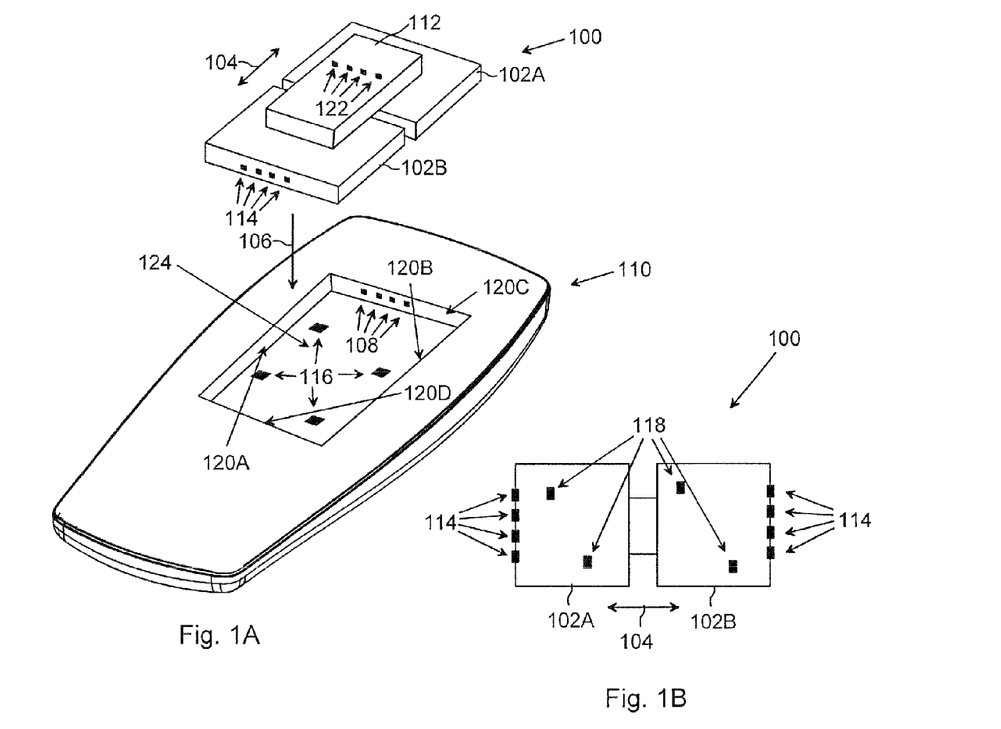
FIG. 1A shows a first example of a structure of a testing adapter according to a first embodiment.
FIG. 1B shows a second example of a structure of a testing adapter according to a first embodiment.

With reference to FIG. 1, examine an example of the structure of a testing adapter 100 according to an embodiment of the invention. The testing adapter 100 comprises a first contact member 102A and a second contact member 102B. The first contact member 102A and the second contact member 102B are dimensioned and mutually located such that the testing adapter 100 may be fitted into a component recess 124 of a wireless telecommunication device 110.

The wireless telecommunication device 110 may also be referred to as a mobile phone, a cellular phone, user equipment, a mobile station, a mobile terminal and/or a wireless telecommunication modem. The present solution, is not, however, restricted to the listed devices, but may be applied to any wireless telecommunication device connectable to a wireless telecommunication network.

The first contact member 102A and the second contact member 102B have at least one degree of freedom 104 relative to each other so that the relative position of the first contact member 102A and the second contact member 102B may be changed, thus providing an attachable and detachable mechanical coupling between the testing adapter 100 and a surface 120A 120D of the component recess 124.

The degree of freedom 104 may be a rotational degree of freedom, which enables relative rotation between the first contact member 102A and the second contact member 102B. The relative rotation may be pivoted such that the overall dimensions of the testing adapter 100 are changed during the relative rotation, thus enabling the testing adapter 100 to be attached to and be detached from the component recess 124.

The at least one degree of freedom 104 has a component parallel to a line between opposite portions of the surface 120A to 120D of the component recess 124. Opposite portions are, for example, portion 120C and portion 120D.

The relative position of the first contact member 102A and the second contact member 102B may be controlled by an actuator mechanism 112, which may be integrated into the first contact member 102A and/or the second contact member 102B.

The testing adapter 100 is pressed in an installation direction 106 into the component recess 124 in a disengaged position of the testing adapter 100. In the disengaged position, the separation between the first contact member 102A and the second contact member 102B is less than the separation between the opposite portions 120C, 120D of the component recess 124. Then, the separation between the first contact member 102A and the second contact member 102A is increased. When the separation is sufficient to provide the mechanical coupling, an engaged position is attained, and the wireless telecommunication device 110 is mechanically supported by the testing adapter 100. The engaged position enables the wireless telecommunication device 110 to be subjected to a testing procedure. The testing procedure may involve an access to, for example, a user interface, data buses and/or power connections of the wireless telecommunication device 110. The testing procedure may also involve a visual inspection of the wireless telecommunication device 110 by a testing system and/or testing personnel.

The testing adapter 100 may be mounted to the testing system not shown in FIG. 1A. The testing system may include a stand for positioning the testing adapter 100 into a position suitable for the testing system and/or testing personnel.

The component recess 124 is typically a hollow for an attachable and a detachable component, such as a battery or a memory card. The component recess 124 may also be referred to as a battery grave or a card slot depending on the embodiment. The testing adapter 100 may be fitted according to the shape of the surface 120A to 120D of the component recess 124 in order to ensure a sufficient mechanical coupling.

The first contact member 102A and the second contact member 102B are made of solid material, such as plastic, ceramics or metal.

With further reference to FIG. 1A, the testing adapter 100 may comprise at least one electric contact member 114 for providing an electric coupling with an electric contact 108, 116 located in the component recess 124. The electric contact member 114 is connected to an electric connector 122, which electric connector 122 is further connected to the testing system. The electric contact members 114 provide an electric access from the testing system to electric test objects, such as power supply, SIM card slot (Subscribe Identity Module), motherboard contact points or test pads, of the wireless telecommunication device 110. The electric access enables test signals to be inputted into and response signals to be outputted from the wireless telecommunication device 110. The electric contact members 114 may be located in accordance with the location of the electric contacts 108, 116.

With reference to FIG. 1B, the testing adapter 100 is shown from a component-recess side. Electric contact members 118 contacting electric contacts 116 located in the bottom of the component recess 124 are shown. The electric contact members 114, 118 may slightly extend from the first contact member 102A and the second contact member 102B in order to ensure a sufficient electric coupling with the electric contacts 108, 116. The electric contacts 114, 118 may be equipped with a suspension mechanism, which limits mechanical force between the electric contact member 114, 118 and the electric contact 108, 116 when the testing adapter 100 is in the engaged position.

Figure 2:
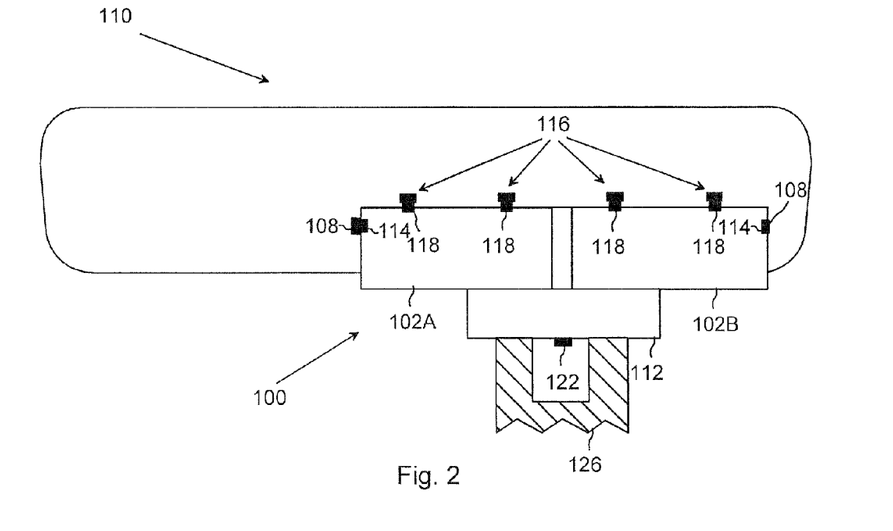
FIG. 2 shows a third example of a structure of a testing adapter according to a first embodiment.

FIG. 2 shows an example of the testing adapter 100 connected to an external support 126, such as a stand. In this example, the testing adapter 100 is in the engaged position, and the electric contact members 114, 118 are connected to the electric contacts 108, 116.

With reference to examples shown in FIGS. 3 to 12, in an embodiment of the invention, the testing adapter 100 comprises a force transforming mechanism coupled with the first contact member 102A and the second contact member 102B. The force transforming mechanism transforms a first force component 304 into a second force component 302, wherein the first force component 304 is generated when the testing adapter 100 is pressed into the component recess 124. The second force component 302 is parallel to a line between opposite portions 120C, 120D of the surface of the component recess 124, thus providing a mechanical coupling between the portion 120D and the first contact member 102A and a mechanical coupling between the portion 120C of the component recess 124 and the second contact member 102B.

The testing adapter 100 may be pressed into the component recess 124 by testing personnel or by an automated mechanism, such as a robot arm.

Figure 3:
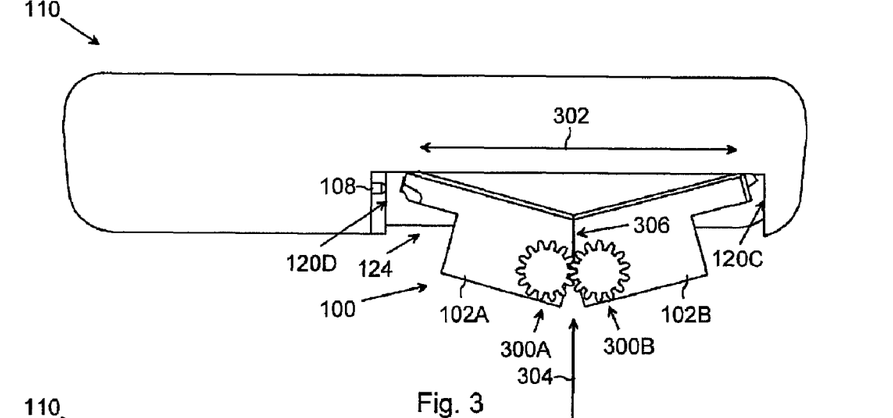
FIG. 3 shows a first example of a structure of a testing adapter according to a second embodiment.

With reference to FIG. 3, the force transform mechanism may be implemented by setting the first contact member 102A and the second contact member 102B against each other and by introducing a folding contact 306 between the first contact member 102A and the second contact member 102B. In the disengaged position of the testing adapter 100, a point of the testing adapter in the vicinity of the folding contact 306 is separated from the bottom of the component recess 124, and the end of the first contact member 102A and the end of the second contact member 102B locate in the vicinity of the bottom of the component recess 124. In this case, the first contact member 102A and the second contact member 102B form a flexible V-shaped testing adapter 100, whose ends approach the opposite portions 120C, 120D of the surface of the component recess 124 when the first force component 304 is applied to the testing adapter 100.

In an embodiment of the invention, the mechanical transmission mechanism comprises a first gear 300A connected to the first contact member 102A and a second gear 300B connected to the second contact member 102B. The first gear 300A and the second gear 300B are compatible with each other, for example, in terms of a tooth size and a tooth separation. The first gear 300A and the second gear 300B are coupled to each other and arranged to transmit rotational force between each other. The gears 300A, 300B may replace a need for the folding contact 306, thus providing a rigid contact between the first contact member 102A and the second contact member 102B in a large scale of rotational angles between the first contact member 102A and the second contact member 102B.

Figure 4:
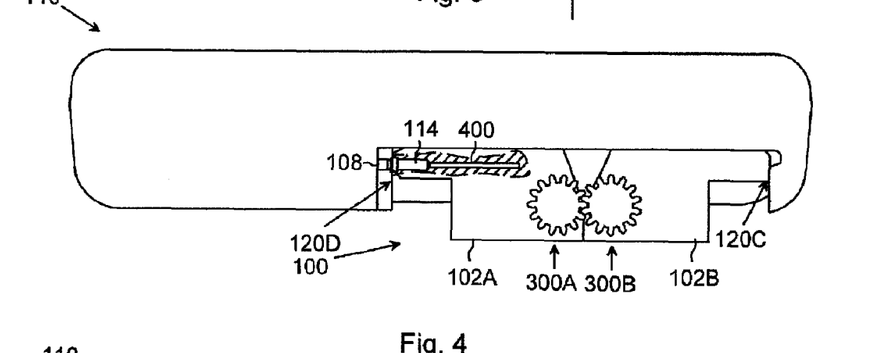
FIG. 4 shows a second example of a structure of a testing adapter according to a second embodiment.

With reference to an example shown FIG. 4, the testing adapter 100 of FIG. 3 is shown in the engaged position. The first contact member 102A is in contact with the surface portion 120D while the second contact member is in contact with the surface portion 120C, thus coupling the testing adapter 100 mechanically with the wireless telecommunication device 110. The electric contact member 114 is in contact with the electric contact 108 of the component recess 124. FIG. 4 also shows a portion of an extension 400 of the electric contact member 114, which extension 400 may be connected to a wire or other means for electrically connecting the electric contact member 114 to the testing system.

Figure 5:
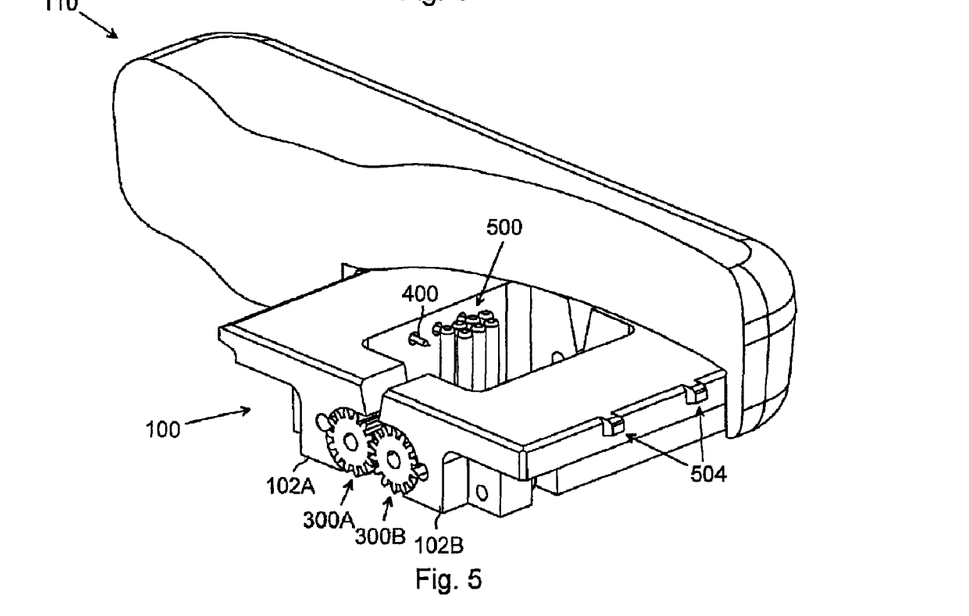
FIG. 5 shows a third example of a structure of a testing adapter according to a second embodiment.

With reference to an example shown in FIG. 5, a testing adapter configuration of FIGS. 3 and 4 is shown from another perspective. FIG. 5 shows the extension 400 and further electric contact members 500 for connecting to electric contacts 118 located in the bottom of the component recess 124. Also, positioning means 504 for providing an accurate mechanical position of the testing adapter 100 relative to the wireless telecommunication device 110 are shown.

With reference to an example shown in FIGS. 6 to 9, in an embodiment of the invention, the first contact member 102A comprises first guiding means 600 for guiding the second contact member 102B apart from the first contact member 102A when the testing adapter is pressed into the component recess 124, thus forming the mechanical coupling between the testing adapter 100 and the surface 120C, 120D of the component recess 124.

Figure 6:
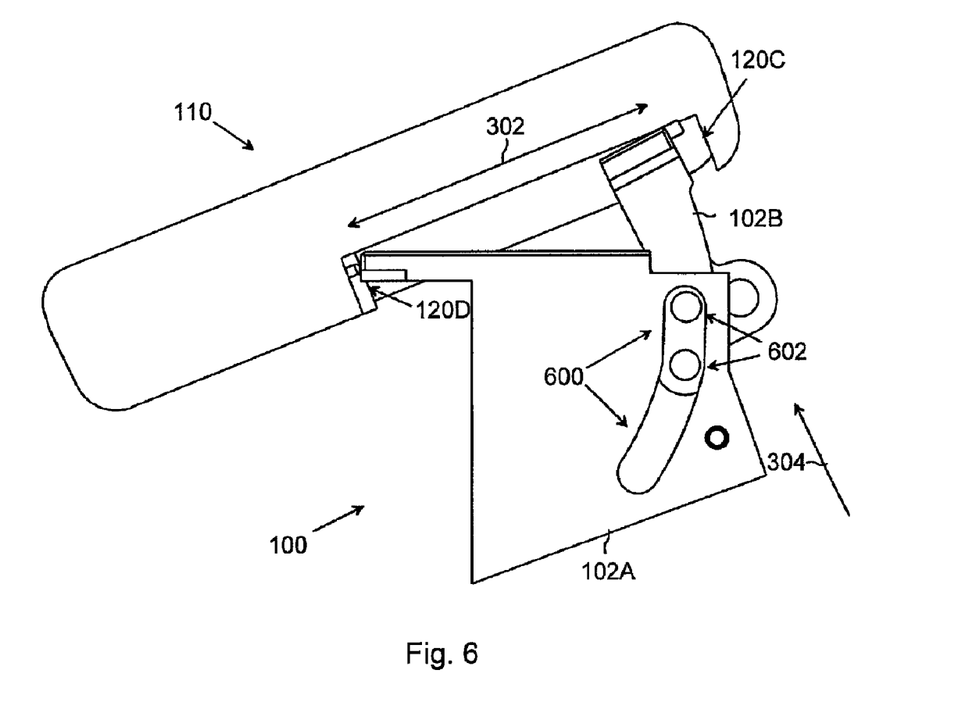
FIG. 6 shows a first example of a structure of a testing adapter according to a third embodiment.

The first guiding means 600 may be a groove 600 formed in the side of the first contact member 102A. The second contact member 102B may comprise an extension 602, such as a bar, which extends from the body of the second contact member 102B into the groove 600.

The guiding means 600 may also be a protruded guiding structure, such as a guiding rail, extending from the first contact member 102A. In such a case, the second contact member 102B comprises a contact structure compatible with the protruded guiding structure.

The guiding means 600 may have curvature so that the second contact member 102B has a curved trajectory when moving the second contact member 102B along the guiding means 600. When applying the first force component 304 to the first contact member 102A, the second contact member 102B follows the curved trajectory relative to the first contact member 102A, thus generating a second force component 302, which increases the relative position of the first contact member 102A and the second contact member 102B. In FIG. 6, the testing adapter 100 is in the disengaged position while in FIG. 7, the testing adapter 100 is reaching the engaged position.

Figure 7:
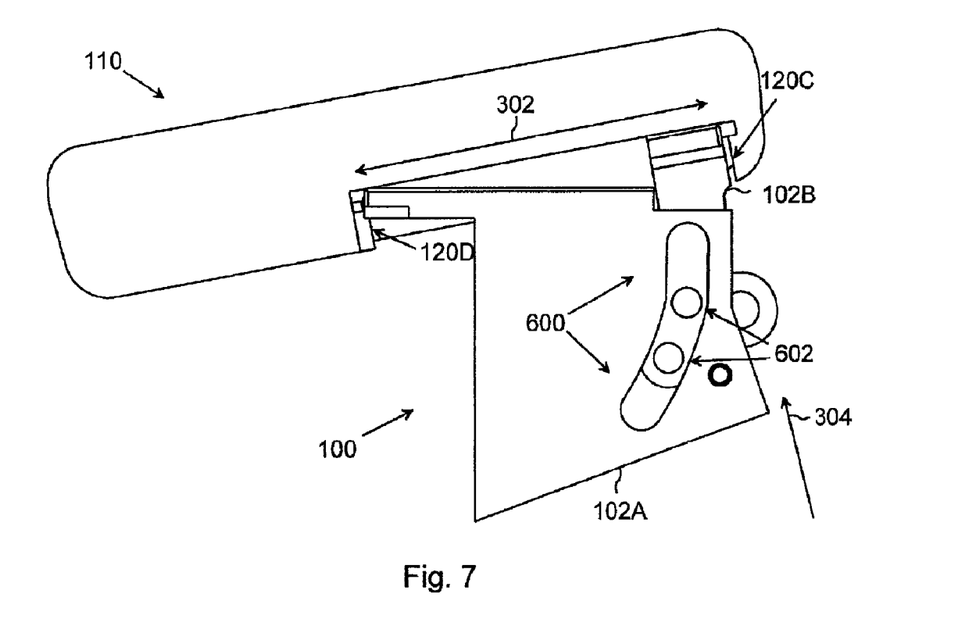
FIG. 7 shows a second example of a structure of a testing adapter according to a third embodiment.
Figure 8:
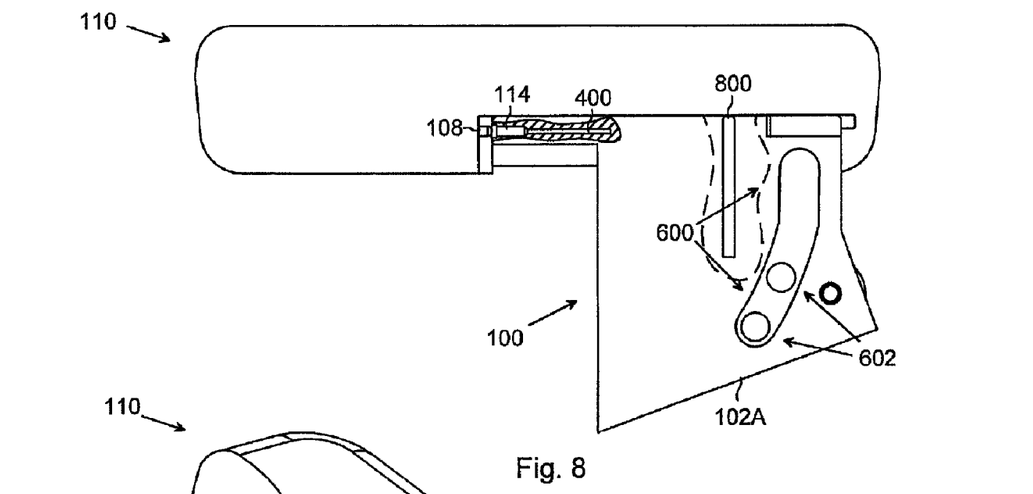
FIG. 8 shows a third example of a structure of a testing adapter according to a third embodiment.

In FIG. 8, the testing adapter of FIGS. 6 and 7 is in the engaged position. FIG. 8 shows the electric contact member 114 which is electrically coupled with the electric contact 108. The extension 400 of the electric contact member 114 and an electric contact member 800 connected to the electric contacts 118 of the bottom of the component recess 124 are also shown.

Figure 9:
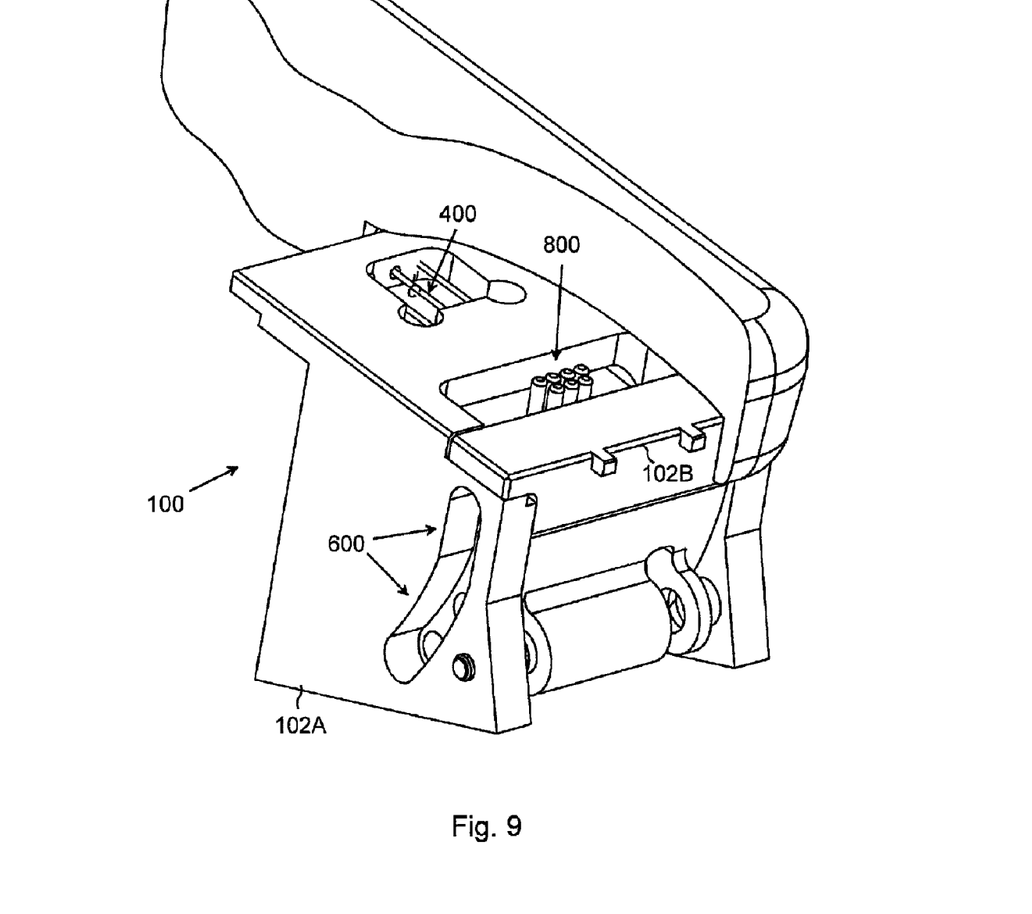
FIG. 9 shows a fourth example of a structure of a testing adapter according to a third embodiment.

FIG. 9 shows the testing adapter of FIGS. 6 to 8 from another perspective. A plurality of extensions 400 of the electric contact members 108 are shown. The testing adapter 100 may further comprise a plurality of electric contact members 800 connecting to the electric contacts 118 located in the bottom of the component recess 124.

Figure 10:
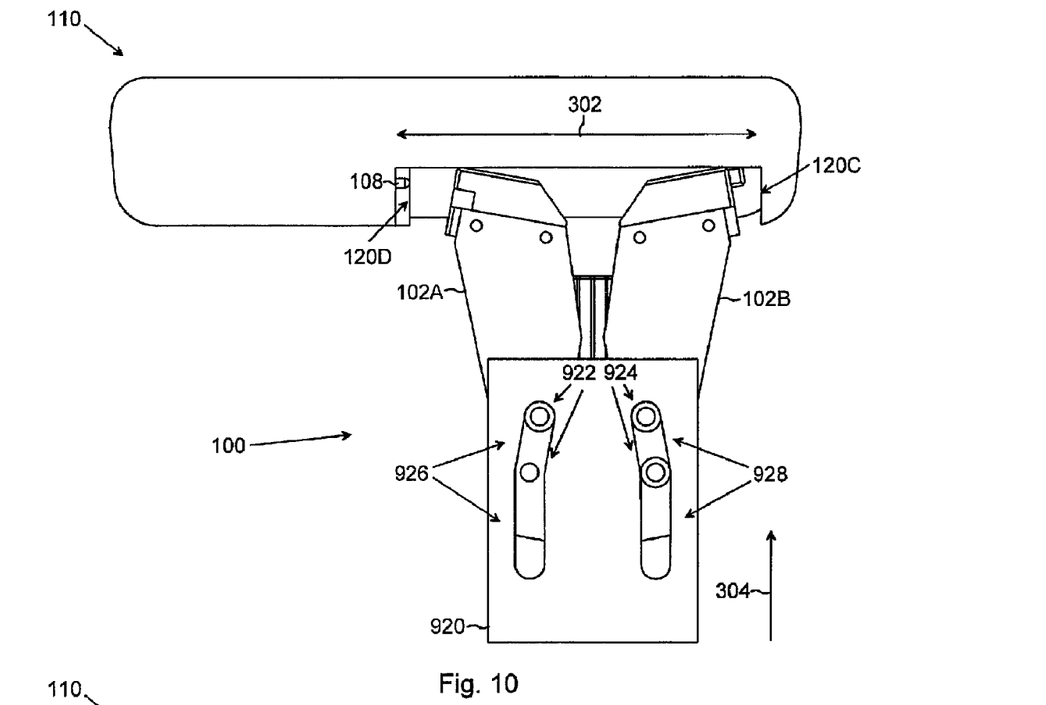
FIG. 10 shows a first example of a structure of a testing adapter according to a fourth embodiment.
Figure 11:
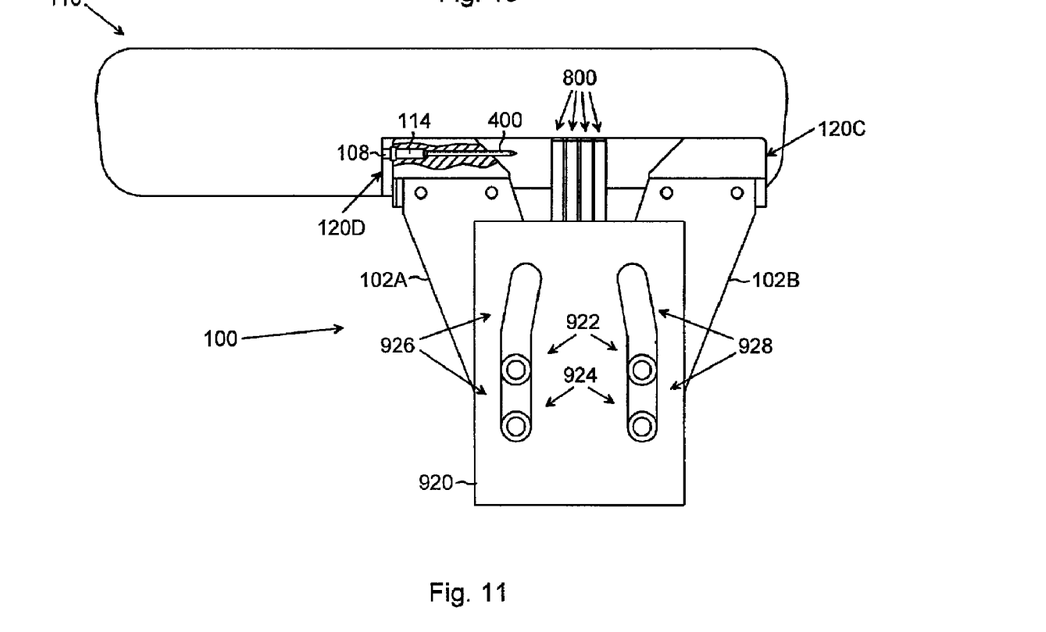
FIG. 11 shows a second example of a structure of a testing adapter according to a fourth embodiment.
Figure 12:
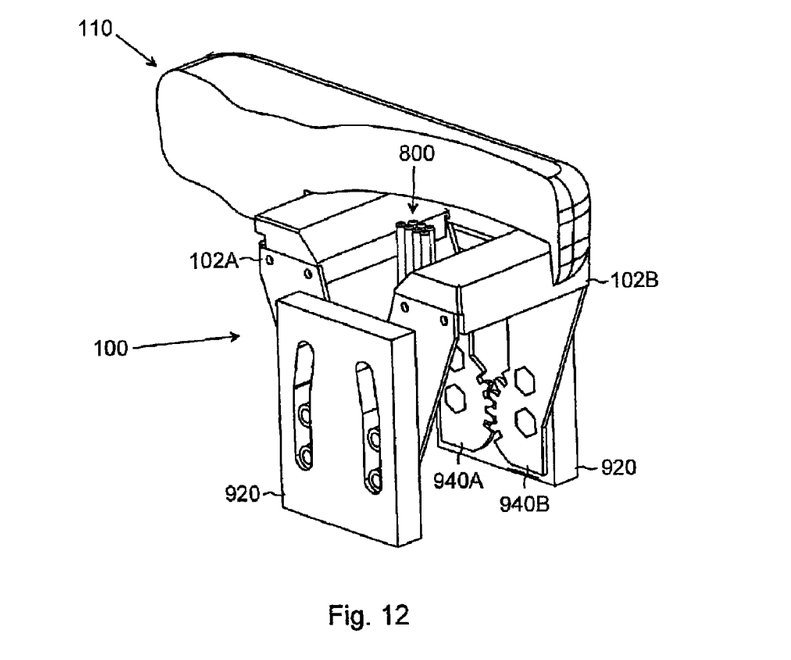
FIG. 12 shows a third example of a structure of a testing adapter according to a fourth embodiment.

With reference to examples of FIGS. 10 to 12, in an embodiment of the invention, the testing adapter 100 comprises a body 920 coupled with the first contact member 102A and the second contact member 102B. The body 920 comprises a second guiding means 926, 928, which guides the second contact member 102B apart from the first contact member 102A when the testing adapter 100 is pressed into the component recess 124, thus forming the mechanical coupling between the testing adapter 100 and the surface 120C, 120D of the component recess 124.

In an embodiment of the invention, the body 920 comprises the second guiding means 926 for guiding the first contact member 102A, and the second contact member 102B is connected to the body 920. In such a case, the second guiding means 928 for guiding the second contact member 102B may not exist.

The second guiding means 926, 928 may be a groove formed in the body 920. The second guiding means 926, 928 may also be a protruded guiding structure.

The first contact member 102A and the second contact member 102B may have an extension 922 and 924, respectively, to be guided by the second guiding means 926, 928.

The guiding means 926, 928 may have curvature so that the first contact member 102A and the second contact member 102B have curved trajectories when moving the first contact member 102A and the second contact member 102B along the guiding means 926, 928. When applying the first force component 304 to the body 920, the first contact member 102A and the second contact member 102B follow the curved trajectories, thus generating a second force component 302, which increases the relative position of the first contact member 102A and the second contact member 102B. In FIG. 10, the testing adapter 100 is in the disengaged position while in FIGS. 11 and 12, the testing adapter 100 is in the engaged positions.

FIG. 11 further shows the extension 400 and the electric contact member 114 connected to the electric contact 108. The electric contact members 800 contacting the electric contacts 118 located in the bottom of the component recess 124 are shown.

With reference to FIG. 12, another perspective of FIGS. 10 and 11 is shown. FIG. 12 shows the gears 940A, 940B, whose function and structure may be similar to those described in conjunction with FIGS. 3 to 5.

Figure 13:
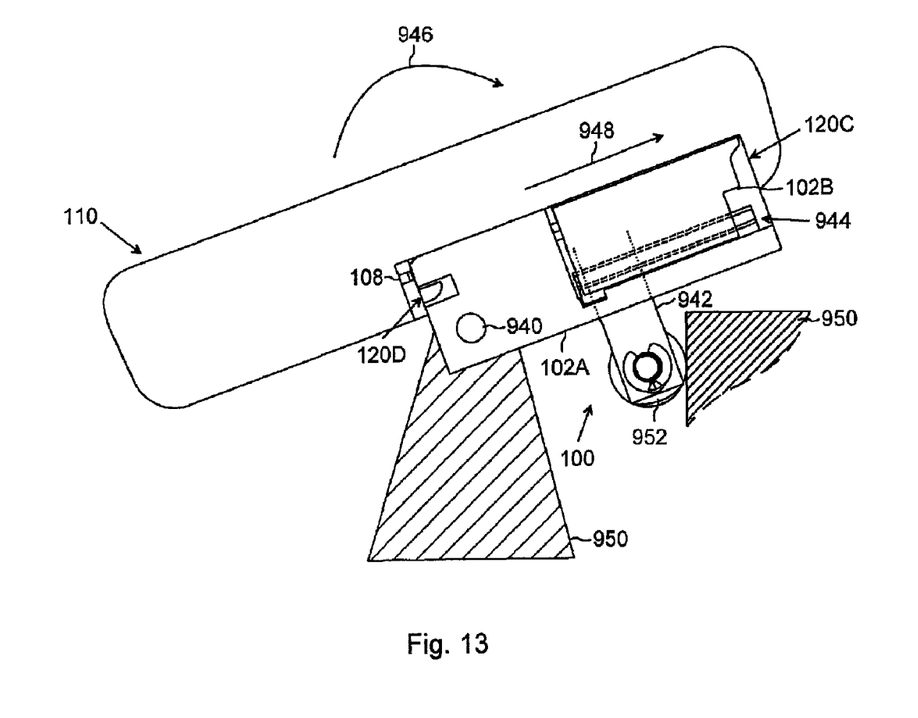
FIG. 13 shows an example of a structure of a testing adapter according to a fifth embodiment.

With reference to FIG. 13, in an embodiment of the invention, the first contact member 102A comprises a third guiding means 944, such as guiding rails, for guiding the second contact member 102B in the direction comprising a direction component parallel to a line between the opposite portions 120C, 120D of the surface of the component recess 124. The testing adapter 100 further comprises a force transmission means 942 coupled with the first contact member 102A or the second contact member 102B. The force transmission means 942 transmits an external force 948 for sliding the first contact member 102A relative to the second contact member 102B. The force trans-mission means 942 may comprise a bar extending from the first contact member 102A or the second contact member 102B, and a bearing 952 for providing a smooth support from an external structure 950.

The second contact member 102B may comprise an open groove compatible with the guiding means 944 in order to provide a sufficient mechanical contact between the first contact member 102A and the second contact member 102B.

The testing adapter 100 may further be axially pivoted to the external structure 950. The force transmission means 942 is supported by the external structure 950 when the testing adapter 100 is rotated about an axial pivot 940, thus causing the first contact member 102A to slide along the third guiding means 944. In the example of FIG. 13, the testing adapter 100 is arranged to provide the engaged position when the force directed at the force transmission means 942 from the external support 950 is decreased. The force from the external support 950 may be controlled by turning the wireless telecommunication device 110 in the direction shown by arrow 946. The testing adapter 100 may further comprise a force means, such as a spring, for forcing the testing adapter 100 into the engaged position when the external support 950 is not applied. The testing adapter 100 is released from the engaged position when supporting the testing adapter 100 to the external support 950.

Even though the invention has been described above with reference to an example according to the accompanying drawings, it is clear that the invention is not restricted thereto but it can be modified in several ways within the scope of the appended claims.

What is claimed is:

1. A testing adapter for testing a wireless telecommunication device, the testing adapter comprising:
    a first contact member; and
    second contact member; and
    a mechanism coupled with the first contact member and the second contact member, the mechanism being configured to provide at least one degree of freedom relative to the first contact member and the second contact member, thereby providing an attachable and detachable mechanical coupling with a surface of a component recess of the wireless telecommunication device on the basis of the at least one degree of freedom.

2. The testing adapter of claim 1, wherein the testing adapter further comprises at least one electric contact member for providing an electric coupling with an electric contact located in the component recess.

3. The testing adapter of claim 1, wherein the first contact member and the second contact member are arranged to provide the mechanical coupling with a component recess selected from a group comprising: a battery grave, a card slot.

4. The testing adapter of claim 1, wherein the testing adapter comprises a force transforming mechanism coupled with the first contact member and the second contact member, for transforming a first force component into a second force component, wherein the first force component is generated when the testing adapter is pressed into the component recess, the second force component being parallel to a line between opposite portions of the surface of the component recess, thus providing a mechanical coupling between the surface of the component recess and the first contact member and a mechanical coupling between the surface of the component recess and the second contact member.

5. The testing adapter of claim 4, wherein the mechanical transmission mechanism comprises a first gear connected to the first contact member and a second gear connected to the second contact member, the first gear and the second gear being arranged to transmit a rotational force between each other.

6. The testing adapter of claim 4, wherein the first contact member comprises first guiding means for guiding the second contact member apart from the first contact member when the testing adapter is pressed into the component recess, thus forming the mechanical coupling between the testing adapter and the surface of the component recess.

7. The testing adapter of claim 4, wherein the testing adapter comprises a body coupled with the first contact member and the second contact member, the body comprising a second guiding means for guiding the second contact member apart from the first contact member when the testing adapter is pressed into the component recess, thus forming the mechanical coupling between the testing adapter and the surface of the component recess.

8. The testing adapter of claim 1, wherein the first contact member comprises a third guiding means for guiding the second contact member in the direction comprising a direction component parallel to a line between opposite portions of the surface of the component recess, the testing adapter further comprising a force transmission means coupled with the first contact member or the second contact member, for transmitting an external force for sliding the first contact member relative to the second contact member, the testing adapter further being axially pivoted to an external structure, the force transmission means being arranged to be supported by the external structure when the testing adapter is rotated about an axial pivot, thus causing the first contact member to slide along the third guiding means.

* * * * *